(12) United States Patent
Guo et al.

(10) Patent No.: US 9,299,490 B2
(45) Date of Patent: Mar. 29, 2016

(54) CIRCUIT BOARD AND POWER CONVERSION APPARATUS HAVING CIRCUIT BOARD

(71) Applicant: Huawei Technologies Co., Ltd., Shenzhen, Guangdong (CN)

(72) Inventors: Quan Guo, Shenzhen (CN); Yongfa Zhu, Shenzhen (CN); Chengzhang Han, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 14/308,960

(22) Filed: Jun. 19, 2014

(65) Prior Publication Data

US 2014/0347825 A1 Nov. 27, 2014

Related U.S. Application Data

(63) Continuation of application No. PCT/CN2013/084549, filed on Sep. 28, 2013.

(30) Foreign Application Priority Data

May 21, 2013 (CN) .......................... 2013 1 0189983

(51) Int. Cl.
*H01F 5/00* (2006.01)
*H01F 27/28* (2006.01)
(Continued)

(52) U.S. Cl.
CPC .............. *H01F 27/2804* (2013.01); *H01F 5/00* (2013.01); *H01F 17/0013* (2013.01); *H01F 17/06* (2013.01); *H05K 1/165* (2013.01); *H05K 7/02* (2013.01); *H02M 3/1588* (2013.01); *H05K 1/0218* (2013.01); *H05K 1/0298* (2013.01); *H05K 3/429* (2013.01); *H05K 2201/086* (2013.01)

(58) Field of Classification Search
CPC ........................ H01F 5/00; H01F 27/00–27/30
USPC ............................ 336/65, 200, 232, 225, 229
See application file for complete search history.

(56) References Cited

U.S. PATENT DOCUMENTS 5,781,091 A * 7/1998 Krone et al. .................. 336/200
7,196,607 B2 * 3/2007 Pleskach et al. .............. 336/200
(Continued)

FOREIGN PATENT DOCUMENTS

CN 1671276 A 9/2005
CN 101657938 A 2/2010
(Continued)

*Primary Examiner* — Tuyen Nguyen

(57) ABSTRACT

The present invention discloses a circuit board, including a substrate and a magnetic core, where the magnetic core is embedded into the substrate, at least one turn of a winding conductor wound around the magnetic core is arranged on the substrate, each turn of the winding conductor includes a first end-surface conductor and a second end-surface conductor that are separately arranged on two ends of the magnetic core, and each turn of the winding conductor further includes a first side-surface conductor that penetrates through the magnetic core from an inner side of the magnetic core and a second side-surface conductor that penetrates through the magnetic core from an outer side of the magnetic core. The circuit board and the power conversion apparatus having the circuit board provided by the present invention, achieve larger inductance, save materials, and reduce cost for fabricating a power conversion apparatus.

15 Claims, 9 Drawing Sheets

(51) Int. Cl.
*H05K 7/02* (2006.01)
*H05K 1/16* (2006.01)
*H01F 17/00* (2006.01)
*H01F 17/06* (2006.01)
*H05K 1/02* (2006.01)
*H05K 3/42* (2006.01)
*H02M 3/158* (2006.01)

(56) References Cited

U.S. PATENT DOCUMENTS

| | | | |
|---|---|---|---|
| 7,271,697 B2* | 9/2007 | Whittaker et al. | 336/229 |
| 2003/0011458 A1* | 1/2003 | Nuytkens et al. | 336/200 |
| 2003/0030533 A1 | 2/2003 | Waffenschmidt | |
| 2004/0150502 A1* | 8/2004 | Jacobson et al. | 336/200 |
| 2006/0081397 A1 | 4/2006 | Enchi et al. | |
| 2006/0109071 A1 | 5/2006 | Thongsouk et al. | |
| 2007/0139151 A1 | 6/2007 | Nussbaum | |
| 2011/0242713 A1* | 10/2011 | Dalmia et al. | 361/56 |
| 2011/0272094 A1* | 11/2011 | Dalmia et al. | 156/293 |
| 2011/0291789 A1* | 12/2011 | Dalmia et al. | 336/200 |
| 2014/0097691 A1* | 4/2014 | Jackson et al. | 307/66 |

FOREIGN PATENT DOCUMENTS

| | | |
|---|---|---|
| CN | 102159037 A | 8/2011 |
| CN | 103298258 A | 9/2013 |
| EP | 1 283 663 A2 | 2/2003 |
| GB | 2461443 A | 1/2010 |
| JP | 2009212265 A | 9/2009 |

* cited by examiner

CIRCUIT BOARD AND POWER CONVERSION APPARATUS HAVING CIRCUIT BOARD

CROSS-REFERENCE TO RELATED APPLICATIONS

This application is a continuation of International Application No. PCT/CN2013/084549, filed on Sep. 28, 2013, which claims priority to Chinese Patent Application No. 201310189983.3, filed on May 21, 2013, both of which are hereby incorporated by reference in their entireties.

TECHNICAL FIELD

The present invention relates to the field of electronic communications technologies, and in particular, to a circuit board and a power conversion apparatus having the circuit board.

BACKGROUND

Dramatic development of the information industry not only provides a huge market and fast-growing force for the power supply industry, but also imposes higher requirements on an installation volume, a weight, efficiency, and output dynamic performance of a power conversion apparatus, and reliability of a system thereof, and the like. "Short, small, light, and thin" is one of major development trends of a power conversion apparatus nowadays.

A magnetic core component on a circuit board of a power conversion apparatus is the largest power component among modular power supplies, which occupies more than 20-30% of a projected area and exerts a greater impact on an appearance structure of a module and a layout of a component. Therefore, people are increasingly concerned about research on a technology related to a magnetic core component and research on high density and compactness of a module.

To achieve high density and compactness, in the prior art, a discrete magnetic core inductor vertically stands on an upper surface of a substrate, a usage area of the substrate is reduced by using a three-dimensional encapsulation structure and by using a space in a vertical direction, thereby reducing an overall volume and improving power density thereof. The power conversion apparatus uses the three-dimensional encapsulation structure, where a discrete inductor is mounted on a substrate, thereby reducing a horizontal area of the substrate. A shield layer is arranged between the inductor and the substrate, achieving an objective of reducing electromagnetic interference. In this technology, an independent inductor and a corresponding shield layer are used, and meanwhile, components on the substrate are encapsulated, so that cost of the power module is high. In another prior art, a magnetic core is arranged on a substrate, and a power circuit module of an indicator is fabricated by directly plating copper on a surface of an inner ring of the annular magnetic core and winding the magnetic core around a via hole around an outer ring of the magnetic core. In this technology, a plated-through hole is arranged on the substrate, the annular magnetic core is placed in the plated-through hole, and a conductive copper layer is formed by directly plating on an inner side wall of the annular magnetic core, a winding of the inductor is formed in combination with winding with the copper wire on the surface of the substrate, and a power circuit with the embedded inductor is used. In this technology, the winding of the magnetic core travels only through the surface of the inner ring of the magnetic core. Therefore, the inductor has only one turn of wire, and an inductance value is small. In addition, because the embedment-type winding manner is used, the embedded magnetic core has a single shape, that is, an annular shape, which cannot meet a requirement during actual applications.

In conclusion, in the prior art, the power conversion apparatus uses an independent inductor and a corresponding shield layer; and meanwhile, the components on the substrate are encapsulated. As a result, the cost of the circuit board is high. In addition, in the prior art, the winding of the magnetic core travels only through the surface of the inner ring of the magnetic core. Therefore, the magnetic core has only one turn of wire, and the inductance value is small, the embedded magnetic core has a single shape, which cannot meet a requirement for large inductance during actual applications.

SUMMARY

An objective of the present invention is to address the foregoing disadvantages of the prior art, and to provide a circuit board and a power conversion apparatus having the circuit board, where no independent inductor or no corresponding shield layer needs to be arranged, thereby reducing cost. Meanwhile, the number of turns of winding may be set to one turn, two turns or even more turns, and an inductance value may be designed to a larger value. Therefore, a usage requirement under an actual condition of larger inductance may be met, and the cost is low.

According to a first aspect, the present invention provides a circuit board, including a substrate and a magnetic core, where the magnetic core is in an annular shape and the magnetic core includes an inner side and an outer side, where the magnetic core is embedded into the substrate, at least one turn of a winding conductor wound around the magnetic core is arranged on the substrate, each turn of the winding conductor includes a first end-surface conductor and a second end-surface conductor that are separately arranged on two ends of the magnetic core, and each turn of the winding conductor further includes a first side-surface conductor that penetrates through the inner side of the magnetic core or penetrates through and arranged on the inner side of the magnetic core and a second side-surface conductor that is arranged on the outer side of the magnetic core, where the first side-surface conductor is electrically connected to the first end-surface conductor and the second end-surface conductor, and the second side-surface conductor is electrically connected to the first end-surface conductor.

With reference to the first aspect, in a first possible implementation manner, the first end-surface conductor is arranged on one end surface of the substrate, and the second end-surface conductor is arranged on the other end surface of the substrate.

With reference to the first aspect, in a second possible implementation manner, a first via hole is arranged on the substrate, where the first via hole is located on the inner side of the magnetic core, and the first side-surface conductor is a conductor filled in the first via hole; or a first plated-through hole that is penetrates through and arranged on the inner side of the magnetic core is arranged on the substrate, and the first side-surface conductor is a conductor that is plated on an inner side wall of the first plated-through hole.

With reference to the first aspect, in a third possible implementation manner, a second via hole is arranged on the substrate, where the second via hole is located on the outer side of the magnetic core, and the second side-surface conductor is a conductor that is filled in the second via hole; or a second plated-through hole is arranged on the substrate, where the second plated-through hole is located on the outer side of the magnetic core, and the second side-surface conductor is a conductor that is plated on an inner side wall of the second plated-through hole.

With reference to the first aspect, in a fourth possible implementation manner, the second side-surface conductor is a conductor that is plated on a side wall of the substrate.

With reference to the first aspect, in a fifth possible implementation manner, the magnetic core is vertically or horizontally embedded into the substrate.

With reference to the first aspect, in a sixth possible implementation manner, the magnetic core is in an annular shape, a polygonal annular shape, a combined shape of a "U" shape and an "I" shape, a combined shape of an "E" shape and an "I" shape, or a combined shape of an "E" shape and another "E" shape.

With reference to the first aspect, in a seventh possible implementation manner, the magnetic core is in a polygonal annular shape and the magnetic core has a plurality of head-tail connected edges; the winding conductor has at least two turns, where at least one turn of the winding conductor is wound around one edge of the magnetic core and at least the other one turn of the winding conductor is wound around another edge of the magnetic core; or all the winding conductor is wound around a same edge of the magnetic core.

With reference to the first aspect, in a eighth possible implementation manner, top and bottom ends of the substrate are end surfaces, where the end surfaces include a front surface and a rear surface that are oppositely arranged, and an outer peripheral wall of the substrate is a side surface of the substrate; an area formed by projection of the magnetic core on the front surface or rear surface of the substrate is an area in which the magnetic core is located; the first end-surface conductor is arranged on the front surface of the substrate, and the second end-surface conductor is arranged on the rear surface of the substrate; the winding conductor has at least two turns, including a first turn of the winding conductor and a second turn of the winding conductor, a first electronic component is arranged on the front surface of the substrate, and the magnetic core is horizontally arranged, where the first electronic component is located outside the area in which the magnetic core is located, the first end-surface conductor of the first turn of the winding conductor is connected to the first electronic component and extends to the area in which the magnetic core is located, the first side-surface conductor of the first turn of the winding conductor is a first conductive via hole, the first end-surface conductor of the first turn of the winding conductor is electrically conductive to a metal layer of the rear surface of the substrate through the first conductive via hole, the second end-surface conductor of the first turn of the winding conductor is connected to the first side-surface conductor of the first turn of the winding conductor, extends to the side surface of the substrate, and is connected to the second side-surface conductor, and the second side-surface conductor of the first turn of the winding conductor is arranged on the side surface of the substrate and connected to the second end-surface conductor of the second turn of the winding conductor; the first end-surface conductor of the second turn of the winding conductor is connected to the second side-surface conductor of the first turn of the winding conductor and extends to the area in which the magnetic core is located, the first side-surface conductor of the second turn of the winding conductor is a second conductive via hole, the first end-surface conductor of the second turn of the winding conductor is electrically conductive to the metal layer of the rear surface of the substrate through the second conductive via hole, the second end-surface conductor of the second turn of the winding conductor is connected to the first side-surface conductor of the second turn of the winding conductor and extends to the side surface of the substrate, and the second side-surface conductor of the second turn of the winding conductor is arranged on the side surface of the substrate and connected to the second end-surface conductor of the first turn of the winding conductor.

With reference to the first aspect, in a ninth possible implementation manner, top and bottom ends of the substrate are end surfaces, where the end surfaces include a front surface and a rear surface that are oppositely arranged, and an outer peripheral wall of the substrate is a side surface of the substrate; an area formed by projection of the magnetic core on the front surface or rear surface of the substrate is an area in which the magnetic core is located; the first end-surface conductor is arranged on the front surface of the substrate, and the second end-surface conductor is arranged on the rear surface of the substrate; the winding conductor has at least two turns, including a first turn of the winding conductor and a second turn of the winding conductor, a first electronic component is arranged on the front surface of the substrate, and the magnetic core is horizontally arranged, where the first electronic component is located outside the area in which the magnetic core is located; the winding conductor includes a first turn of the winding conductor and a second turn of the winding conductor, a first electronic component is arranged on the front surface of the substrate, where the first electronic component is located outside the area in which the magnetic core is located, and a plated-through hole penetrating through the substrate is arranged within the area in which the magnetic core is located; the first end-surface conductor of the first turn of the winding conductor is connected to the first electronic component, extends to a side wall of the plated-through hole, and is connected to the first side-surface conductor of the first turn of the winding conductor, the first side-surface conductor of the first turn of the winding conductor is a first conductive layer that is arranged on the side wall of the plated-through hole, the first end-surface conductor of the first turn of the winding conductor is electrically conductive to a metal layer on the rear surface of the substrate through the first conductive layer, the second end-surface conductor of the first turn of the winding conductor is connected to the first side-surface conductor of the first turn of the winding conductor and extends to the side surface of the substrate, and the second side-surface conductor of the first turn of the winding conductor is arranged on the side surface of the substrate and connected to the second end-surface conductor of the first turn of the winding conductor; the first end-surface conductor of the second turn of the winding conductor is connected to the second side-surface conductor of the first turn of the winding conductor and extends to the side wall of the plated-through hole, the first side-surface conductor of the second turn of the winding conductor is a second conductive layer that is arranged on the side wall of the plated-through hole, the first end-surface conductor of the second turn of the winding conductor is electrically conductive to the metal layer on the rear surface of the substrate through the second conductive layer, the second end-surface conductor of the second turn of the winding conductor is connected to the first side-surface conductor of the second turn of the winding conductor and extends to the side surface of the substrate, and the second side-surface conductor of the second turn of the winding conductor is arranged on the side surface of the substrate and connected to the second end-surface conductor of the second turn of the winding conductor.

With reference to the first aspect, in a tenth possible implementation manner, top and bottom ends of the substrate are end surfaces, where the end surfaces include a front surface and a rear surface, and an outer peripheral wall of the substrate is a side surface of the substrate; an area formed by the magnetic core on the front surface or rear surface of the substrate is an area in which the magnetic core is located; the winding conductor includes a first turn of the winding conductor and a second turn of the winding conductor, a first electronic component is arranged on the front surface of the substrate, and the magnetic core is vertically arranged; there is a conductor layer inside the substrate; the first end-surface conductor of the first turn of the winding conductor includes a first section of an conductor that is connected to the first electronic component and located on the front surface of the substrate and a second section of the conductor that is connected to the first section of the conductor and electrically conductive to the inner layer of the substrate, where the second section of the conductor is the conductor layer that is arranged on the inner layer of the substrate, and the conductor layer is located between the front surface and the rear surface of the substrate; a third conductive via hole adjacent to the magnetic core is arranged on the substrate, the first side-surface conductor of the first turn of the winding conductor is connected to the second section of the conductor and electrically conductive to the third conductive via hole within the area in which the magnetic core is located, the second end-surface conductor of the first turn of the winding conductor is connected to the first side-surface conductor of the first turn of the winding conductor and penetrates through the magnetic core, the second side-surface conductor of the first turn of the winding conductor is connected to the second end-surface conductor of the first turn of the winding conductor and electrically conductive to a front surface of the substrate; the first end-surface conductor of the second turn of the winding conductor is connected to the second side-surface conductor of the first turn of the winding conductor, the first side-surface conductor of the second turn of the winding conductor is a conductive via hole that is connected to the first end-surface conductor of the second turn of the winding conductor and electrically conductive to the area in which the magnetic core is located, the second end-surface conductor of the second turn of the winding conductor is connected to the first side-surface conductor of the second turn of the winding conductor and penetrates through the magnetic core, the second side-surface conductor of the second turn of the winding conductor is connected to the second end-surface conductor of the second turn of the winding conductor and electrically conductive to the front surface of the substrate.

According to a second aspect, the present invention provides a power conversion apparatus. The power conversion apparatus includes the foregoing circuit board, where a capacitor, a resistor, and a control module that is configured to generate a control signal are arranged on the circuit board, where the capacitor, the resistor, and the control module are all connected to the substrate.

According to the circuit board and the power conversion apparatus having the circuit board provided by the present invention, the magnetic core is embedded and different manners of winding the magnetic core are used, which may reduce the usage area of the substrate and flexibly use a wire routing space of the conductive layer of the substrate. The winding conductor may flexibly traverse the surface and inside of the substrate, and both the shape of the magnetic core and the number of turns of the winding conductor may be flexibly set according to actual conditions, where larger inductance may be designed according to an actual condition to improve inductance consistency. The magnetic core is embedded into the substrate, with no need of arranging a shield layer or encapsulating electronic components on the substrate. In this way, materials are saved, the process is simplified, and the fabrication cost is reduced, thereby achieving an objective of saving materials and reducing the cost for fabricating a power conversion apparatus.

DETAILED DESCRIPTION

To make the objectives, technical solutions, and advantages of the present invention clearer, the following further describes in detail the present invention with reference to the accompanying drawings and embodiments. It should be understood that the specific embodiments described herein are merely provided to illustrate the present invention, and are not intended to limit the present invention.

Embodiment 1

Figure 1A:
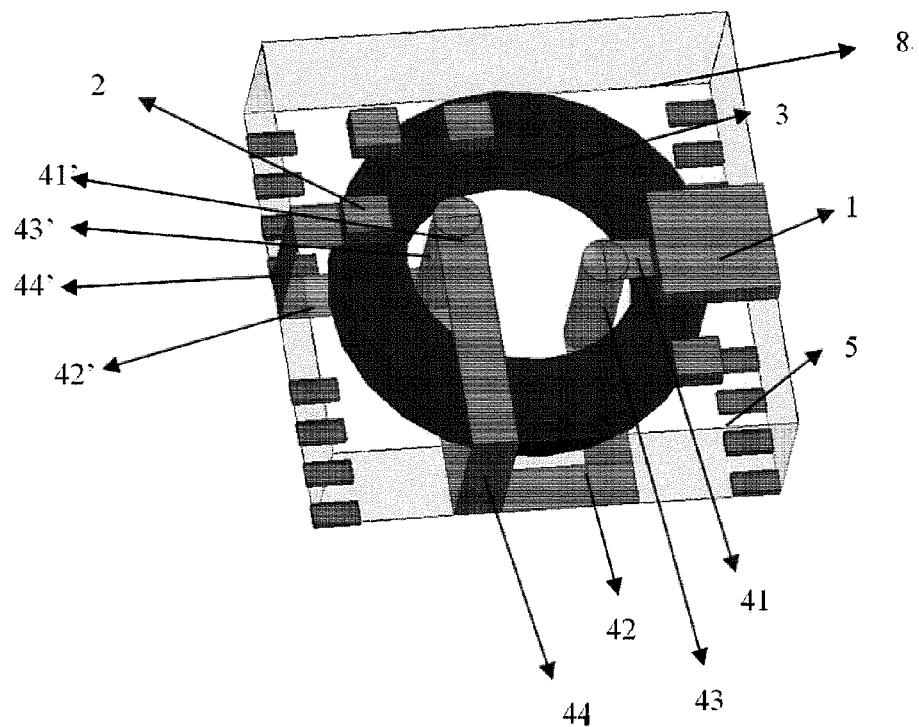
FIG. 1a is a three-dimensional schematic diagram of a circuit board according to Embodiment 1 of the present invention.
Figure 1B:
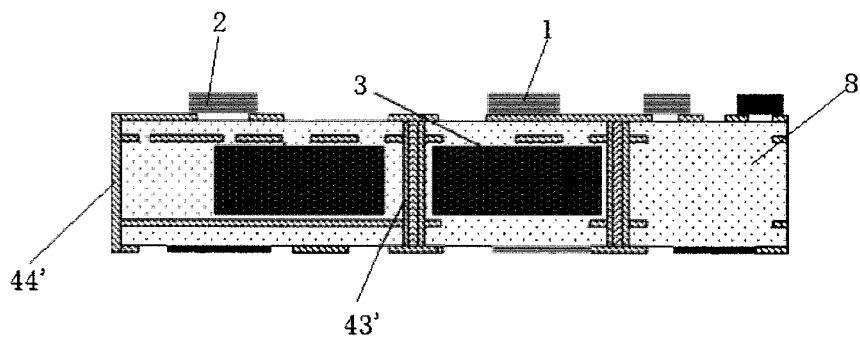
FIG. 1b is a sectional schematic diagram of a circuit board according to Embodiment 1 of the present invention.

As illustrated in FIG. 1a and FIG. 1b, an embodiment of the present invention provides a circuit board, including a substrate 8 and a magnetic core 3, where the magnetic core 3 is embedded into the substrate 8. The magnetic core 3 is in an annular shape, and the magnetic core 3 has an inner side and an outer side. The inner side refers to an area enclosed by an inner peripheral wall of the magnetic core 3, and the outer side refers to an area outside an outer peripheral wall of the magnetic core 3. It can be understood that, the magnetic core 3 may be in a closed annular shape, or in an open annular shape. In a practical application, a slot may be arranged on the substrate 8, the magnetic core 3 may be placed in the slot, and the slot is filled by a material so that the magnetic core 3 is embedded into the substrate 8.

As illustrated in FIGS. 1a and 1b, at least one turn of a winding conductor wound around the magnetic core 3 is arranged on the substrate 8, where each turn of the winding conductor includes a first end-surface conductor 41 and a second end-surface conductor 42 that are separately arranged on two ends of the magnetic core 3, and each turn of the winding conductor further includes a first side-surface conductor 43 that penetrates through or penetrates through and arranged on the inner side of the magnetic core 3, and a second side-surface conductor 44 that is arranged on the outer side of the magnetic core 3. The second side-surface conductor 44 penetrates through the magnetic core 3 from the outer side of the magnetic core 3. The first side-surface conductor 43 is electrically connected to the first end-surface conductor 41 and the second end-surface conductor 42, the second side-surface conductor 44 is electrically connected to the first end-surface conductor 41 or the second end-surface conductor 42. In this way, the first end-surface conductor 41, the first side-surface conductor 43, the second end-surface conductor 42, and the second side-surface conductor 44 may form a turn of the winding conductor wound around the magnetic core 3. The number of turns of the winding conductor may be set according to an actual condition and may be two or more than two. Moreover, the magnetic core 3 may be in an annular shape, a framework shape, a "U" shape, an "E" shape, or a like proper shape. According to the embodiments of the present invention, the winding conductors may be all conveniently wound around the magnetic core 3, and the shape of the magnetic core 3 and the number of turns of the winding conductor may be flexibly set according to an actual condition. An inductance value of the magnetic core 3 may be set to a larger value to perfectly meet an actual usage requirement. In addition, the magnetic core 3 is embedded into the substrate 8, with no need of arranging a shield layer or encapsulating electronic components on the substrate 8. In this way, the fabrication cost is low.

Specifically, as illustrated in FIG. 1a and FIG. 1b, the first end-surface conductor 41 is arranged on one end surface of the substrate 8, and the second end-surface conductor 42 is arranged on the other end surface of the substrate 8. The substrate 8 has a front surface and a rear surface that are oppositely arranged. The first end-surface conductor 41 may be located on the front surface of the substrate 8, and the second end-surface conductor 42 may be located on the rear surface of the substrate 8. Certainly, the first end-surface conductor 41 may also be located inside the substrate 8 and located on one side of the magnetic core 3, and the second end-surface conductor 42 may also be located inside the substrate 8 and located on the other side of the magnetic core 3, where the first end-surface conductor 41 and the second end-surface conductor 42 may be both arranged in a spaced-apart manner with respect to the magnetic core 3. It can be understood that, in this embodiment, the first end-surface conductor 41 and the second end-surface conductor 42 may be located on the same layer of the substrate 8, or may be separately located on different step-like layers of the substrate 8, where adjacent layers may be connected by a conductive via hole.

Specifically, as illustrated in FIG. 1a and FIG. 1b, a first via hole is arranged on the substrate 8, where the first via hole is located on the inner side of the magnetic core 3, the first side-surface conductor 43 is a conductor filled in the first via hole, and the first via hole and the conductor filled or plated in the first via hole form a conductive via hole, so as to implement a function of layer exchanging (that is, electrical conduction; the layer exchanging is a commonly used term in the field of PCB technologies and used to implement signal communication between different layers). The conductive via hole is also referred to as the via hole, which is a hole for electrical connection between a plurality of layers of a PCB board (Printed Circuit Board, printed circuit board), and connects printed wires between layers. The conductive via hole may be fabricated by using the plating copper process. Certainly, it can be understood that, a manner of layer exchanging may be layer exchanging from the front surface of the substrate 8 to the rear surface of the substrate 8 or to an inner metal layer of the substrate 8, and alternatively from one inner metal layer of the substrate 8 to another inner metal layer.

As illustrated in FIG. 1a and FIG. 1b, in this embodiment, specifically, top and bottom ends of the substrate 8 are end surfaces, where the end surfaces include a front surface and a rear surface that are oppositely arranged, and an outer peripheral wall of the substrate 8 is a side surface of the substrate 8. An area formed by projection of the magnetic core 3 on the front surface or rear surface of the substrate 8 is an area in which the magnetic core 3 is located. The first end-surface conductor 41 is arranged on the front surface of the substrate 8, and the second end-surface conductor 42 is arranged on the rear surface of the substrate 8. The winding conductor includes a first turn of the winding conductor and a second turn of the winding conductor, and certainly, may further include more turns of the winding conductor: a third turn of the winding conductor, a fourth turn of the winding conductor, and so on, which are set as required. A first electronic component 1 is arranged on the front surface of the substrate 8, where the first electronic component 1 may be a chip. The magnetic core 3 is horizontally embedded into the substrate 8, and the magnetic core 3 is in an annular shape. The first electronic component 1 is located outside the area in which the magnetic core 3 is located. In this embodiment, the expression "the area in which the magnetic core 3 is located" refers to an area formed by projection of the magnetic core 3 on the substrate 8 along an axial direction. The first end-surface conductor 41 of the first turn of the winding conductor is connected to the first electronic component 1 and extends, in a wire routing manner, to the area in which the magnetic core 3 is located. The first side-surface conductor 43 of the first turn of the winding conductor is a first conductive via hole. The first end-surface conductor 41 of the first turn of the winding conductor is vertically layer-exchanged to a metal layer on the rear surface of the substrate 8 by using the first side-surface conductor 43 of the first turn of the winding conductor. The second end-surface conductor 42 of the first turn of the winding conductor is connected to the first side-surface conductor 43 of the first turn of the winding conductor, extends to the side surface of the substrate 8 in a wire routing or layout manner, and is connected to the second side-surface conductor 44. The second side-surface conductor 44 of the first turn of the winding conductor is arranged on the side surface of the substrate 8 and connected to the second end-surface conductor 42 of the first turn of the winding conductor, thereby forming a turn of the winding conductor. The first end-surface conductor 41' of the second turn of the winding conductor is connected to the second end-surface conductor 42 of the first turn of the winding conductor and extends to the area in which the magnetic core 3 is located. The first side-surface conductor 43' of the second turn of the winding conductor is a second conductive via hole. The first end-surface conductor 41' of the second turn of the winding conductor is vertically layer-exchanged to the metal layer on the rear surface of the substrate 8 by using the first side-surface conductor 43' of the second turn of the winding conductor. The second end-surface conductor 42' of the second turn of the winding conductor is connected to the first side-surface conductor 43' of the second turn of the winding conductor and extends to the side surface of the substrate 8. The second side-surface conductor 44' of the second turn of the winding conductor is arranged on a side wall of the substrate 8 and connected to the second end-surface conductor 42' of the second turn of the winding conductor, thereby forming another turn of the winding conductor. In addition, another electronic component may be connected to the second side-surface conductor 44' by a copper sheet that is arranged on the front surface of the substrate 8. Certainly, on a basis of the second turn of the winding conductor, the proper number of turns, such as the third turn of the winding conductor and the fourth turn of the winding conductor may further be set, and a second electronic component 2 is connected to the last turn of the winding conductor.

Embodiment 2

Figure 2:
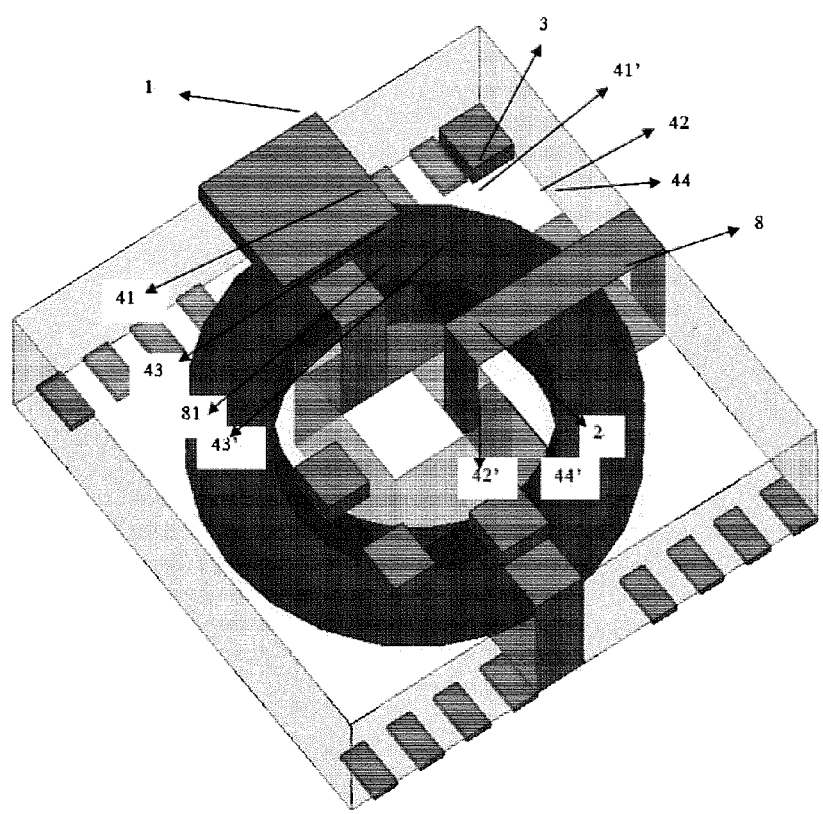
FIG. 2 is a three-dimensional schematic diagram of a circuit board according to Embodiment 2 of the present invention.

Alternatively, as illustrated in FIG. 2, as an alternative solution for the first and second conductive via holes in Embodiment 1, a first plated-through hole 81 penetrates through and arranged on the inner side of the magnetic core 3 is arranged on the substrate 8, where the first plated-through hole 81 penetrates through the substrate and penetrates through an inner ring of the magnetic core 3. The first side-surface conductor 43 is a conductor that is plated on an inner side wall of the first plated-through hole 81, where the conductor is in a strip shape and two ends of the conductor are aligned with the front surface and the rear surface of the substrate 8. The first side-surface conductor 43 may be directly layer-exchanged to the other surface of the substrate 8. The corresponding number of conductors may be arranged on an inner side of the first plated-through hole 81 according to the number of turns of the winding conductor. In a practical application, the first plated-through hole 81 may be in a circular shape, a polygonal shape, or a like proper shape. In this embodiment, the magnetic core 3 may be in a rectangle framework shape, the first plated-through hole 81 is correspondingly in a rectangular shape, so that the conductor is plated on a side wall of the first plated-through hole 81. Certainly, it can be understood that, the first plated-through hole 81 may be a straight hole, a step-like hole, or another proper type of hole. If the first plated-through hole 81 is a step-like hole, correspondingly the conductor on the inner side of the first plated-through hole 81 is also in a step-like shape.

As an alternative solution, a second via hole (not illustrated in the figure) is arranged on the substrate 8, where the second via hole is located on an outer side of the magnetic core 3, and the second side-surface conductor 44 is a conductor filled in the second via hole. The second via hole and the conductor filled or plated in the second via hole form a conductive via hole, so as to implement a function of layer exchanging. Certainly, it can be understood that, a manner of layer exchanging may be layer exchanging from the front surface of the substrate 8 to the rear surface of the substrate 8 or to an inner metal layer of the substrate 8, and alternatively from one inner metal layer of the substrate 8 to another inner metal layer. Alternatively, as an alternative solution for a solution in which the second side-surface conductor is a conductive via hole, a second plated-through hole (not illustrated in the figure) is arranged on the substrate 8, where the second plated-through hole is located on the outer side of the magnetic core 3, and the second side-surface conductor 44 is a conductor that is plated on an inner side wall of the second plated-through hole.

It can be understood that, an electronic component, for example, a chip, a capacitor, or the like, on the substrate 8 may also be directly connected to the conductive via hole.

In this embodiment, the second side-surface conductor 44 is a conductor that is plated on the side wall of the substrate 8, the second side-surface conductor 44 may be in a strip shape, where two ends of the conductor are aligned with the front surface and the rear surface of the substrate 8. In this way, the substrate 8 is fully utilized, the fabrication process is simplified, and the cost is reduced.

In a practical application, the magnetic core 3 may be vertically, horizontally, or even slantingly embedded into the substrate 8. Correspondingly, a straight wire manner of the winding conductor is correspondingly changed.

Specifically, the magnetic core 3 may be in an annular shape, and the magnetic core 3 may have a plurality of head-tail connected edges. For example, the magnetic core may be in a polygonal annular shape, in an annular shape, in a track shape, or in a special shape; or in a combined shape of a "U" shape and an "I" shape, a combined shape of an "E" shape and an "I" shape, or a combined shape of an "E" shape and another "E" shape. There is a wide selection for the magnetic core 3, and therefore larger inductance may be achieved.

In this embodiment, the magnetic core 3 is in a polygonal annular shape. Using the magnetic core 3 in a rectangular framework shape as an example, the winding conductor has at least two turns, and all the winding conductor may be wound around the same edge of the magnetic core 3. Alternatively, at least one turn is wound opposite one edge of the magnetic core 3, and at least another one turn is wound opposite, adjacently, or spaced-apart from another edge of the magnetic core 3. A specific winding manner may be set according to an actual condition, thereby achieving higher flexibility and larger inductance.

Specifically, the substrate 8 has a front surface and a rear surface that are oppositely arranged. The first end-surface conductor 41 is arranged on the front surface of the substrate 8. The second end-surface conductor 42 is arranged on the rear surface of the substrate 8. The winding conductor includes a first turn of the winding conductor and a second turn of the winding conductor. A first electronic component 1 is arranged on the front surface of the substrate 8. The magnetic core 3 is horizontally arranged. The first electronic component 1 is located outside an area in which the magnetic core 3 is located. The first end-surface conductor 41 of the first turn of the winding conductor is connected to the first electronic component 1 and extends to a side wall of the plated-through hole 81. The first side-surface conductor 43 of the first turn of the winding conductor is a first conductive layer that is arranged on the side wall of the plated-through hole 81. The first end-surface conductor 41 of the first turn of the winding conductor is electrically conductive to a metal layer on the rear surface of the substrate 8 by using the first side-surface conductor 43 of the first turn of the winding conductor. The second end-surface conductor 42 of the first turn of the winding conductor is connected to the first side-surface conductor 43 of the first turn of the winding conductor and extends to the side surface of the substrate 8. The second side-surface conductor 44 of the first turn of the winding conductor is arranged on the side wall of the substrate 8 and connected to the second end-surface conductor 42 of the first turn of the winding conductor. The first end-surface conductor 41' of the second turn of the winding conductor is connected to the second side-surface conductor 44 of the first turn of the winding conductor and extends to the side wall of the plated-through hole 81. The first side-surface conductor 43' of the second turn of the winding conductor is a second conductive layer that is arranged on the side wall of the plated-through hole 81. The first end-surface conductor 41' of the second turn of the winding conductor is electrically conductive to a metal layer on rear back surface of the substrate 8 by using the first side-surface conductor 43' of the second turn of the winding conductor. The second end-surface conductor 42' of the second turn of the winding conductor is connected to the first side-surface conductor 43' of the second turn of the winding conductor and extends to the side surface of the substrate 8. The second side-surface conductor 44' of the second turn of the winding conductor is arranged on the side wall of the substrate 8 and connected to the second end-surface conductor 42' of the second turn of the winding conductor.

Embodiment 3

Figure 3:
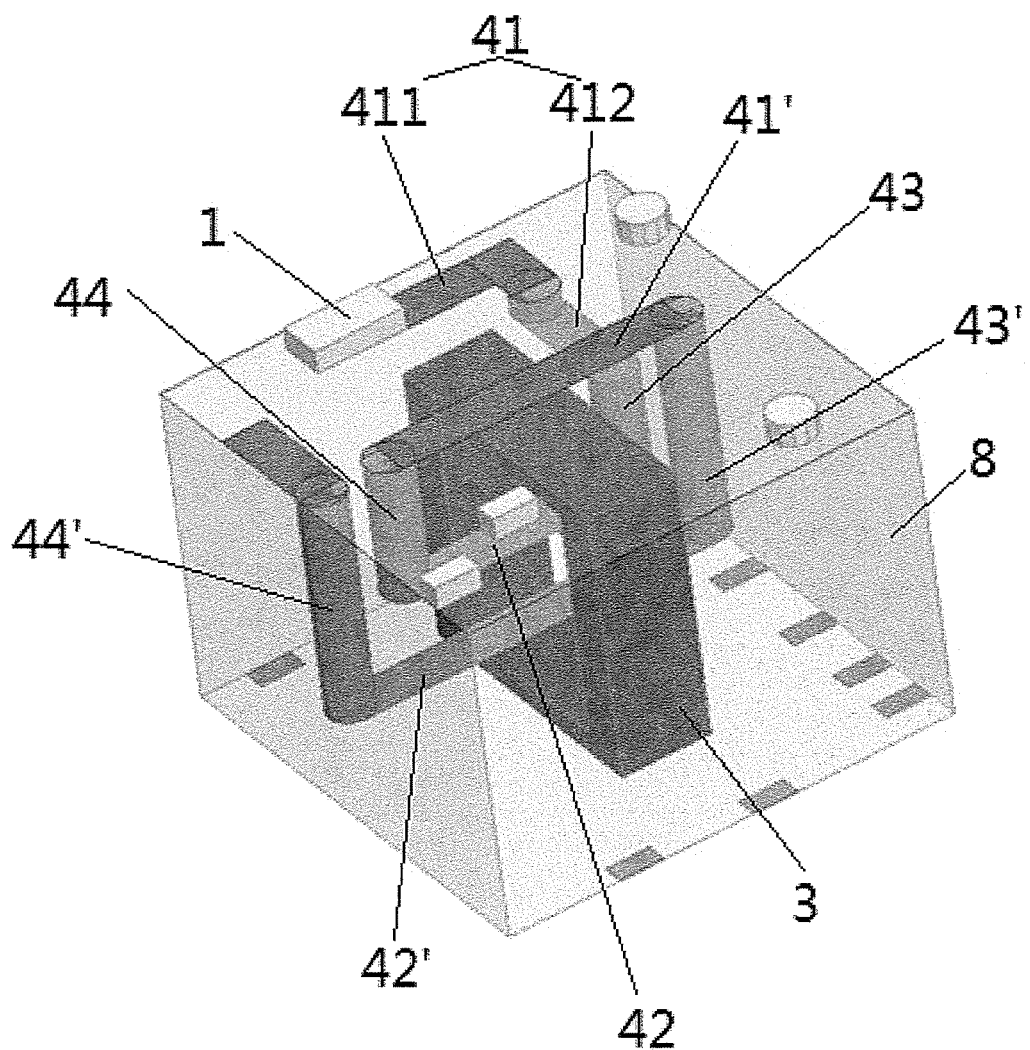
FIG. 3 is a three-dimensional schematic diagram of a circuit board according to Embodiment 3 of the present invention.
Figure 4:
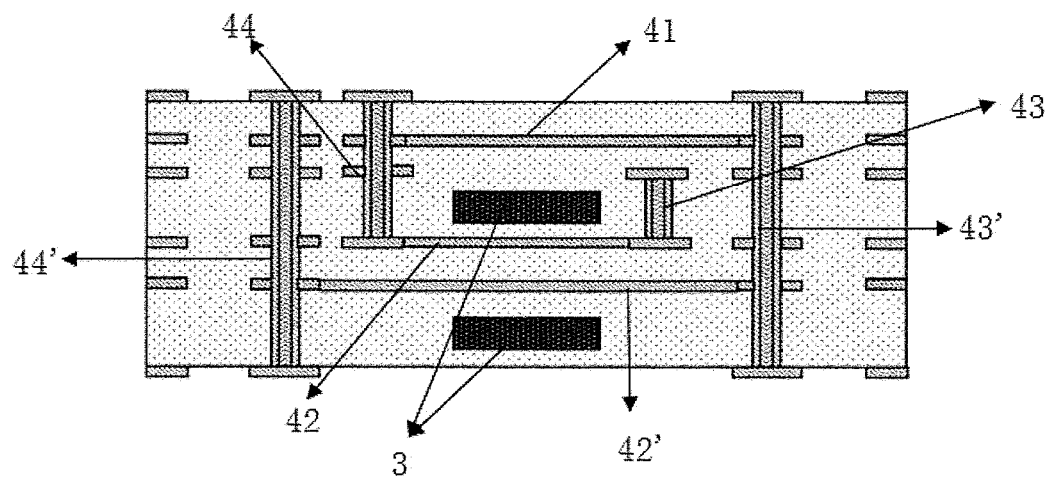
FIG. 4 is a sectional schematic diagram of the circuit board illustrated in FIG. 3.
Figure 5:
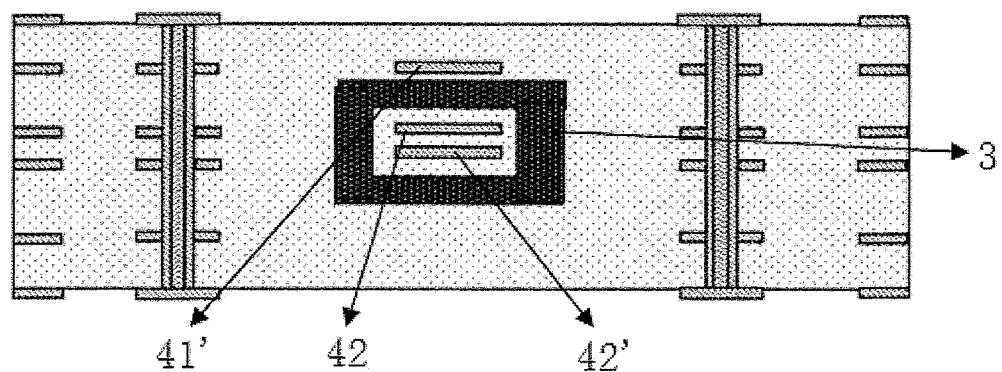
FIG. 5 is another sectional schematic diagram of the circuit board illustrated in FIG. 3.

As illustrated in FIG. 3 to FIG. 5, different from the foregoing embodiments, in this embodiment, a magnetic core 3 is vertically embedded into a substrate 8.

Top and bottom ends of the substrate 8 are end surfaces. The end surfaces include a front surface and a rear surface that are oppositely arranged. An outer peripheral wall of the substrate 8 is a side surface of the substrate. An area formed by the magnetic core 3 on the front surface or rear surface of the substrate 8 is an area in which the magnetic core is located. An inner layer of the substrate 8 has a conductor layer. A first end-surface conductor 41 is arranged on the front surface of the substrate 8. A second end-surface conductor 42 is arranged on the rear surface of the substrate 8. A winding conductor includes a first turn of the winding conductor and a second turn of the winding conductor. A first electronic component 1 is arranged on the front surface of the substrate 8. The first end-surface conductor 41 of the first turn of the winding conductor includes a first section of a conductor 411 that is connected to the first electronic component 1 and located on the front surface of the substrate 8 and a second section of the conductor 412 that is connected to the first section of the conductor 411 and electrically conductive to the inside of the substrate 8. A first side-surface conductor 43 of the first turn of the winding conductor is a third conductive via hole that is connected to the second section of the conductor 412 and electrically conductive to the area in which the magnetic core 3 is located. The second end-surface conductor 42 of the first turn of the winding conductor is connected to the first side-surface conductor 43 of the first turn of the winding conductor and penetrates through the inner side of the magnetic core 3. A second side-surface conductor 44 of the first turn of the winding conductor is connected to the second end-surface conductor 42 of the first turn of the winding conductor and electrically conductive to a front surface of the substrate. A first end-surface conductor 41' of the second turn of the winding conductor is connected to the second side-surface conductor 44 of the first turn of the winding conductor and crosses the outer side of the magnetic core 3. A first side-surface conductor 43' of the second turn of the winding conductor is a fourth conductive via hole that is connected to the first end-surface conductor 41' of the second turn of the winding conductor and electrically conductive to the area in which the magnetic core 3 is located. A second end-surface conductor 42' of the second turn of the winding conductor is connected to the first side-surface conductor 43 of the first turn of the winding conductor and penetrates through the inner side of the magnetic core 3. A second side-surface conductor 44' of the second turn of the winding conductor is connected to the second end-surface conductor 42 of the second turn of the winding conductor and electrically conductive to the front surface of the substrate. Related electronic components such as capacitors may be connected to the second end-surface conductor 42' by a copper sheet. Certainly, the proper number of turns of the winding conductor, such as a third turn of the winding conductor and a fourth turn of the winding conductor, may further be set according to an actual condition. The winding conductor may also be designed with only one turn.

Figure 6:
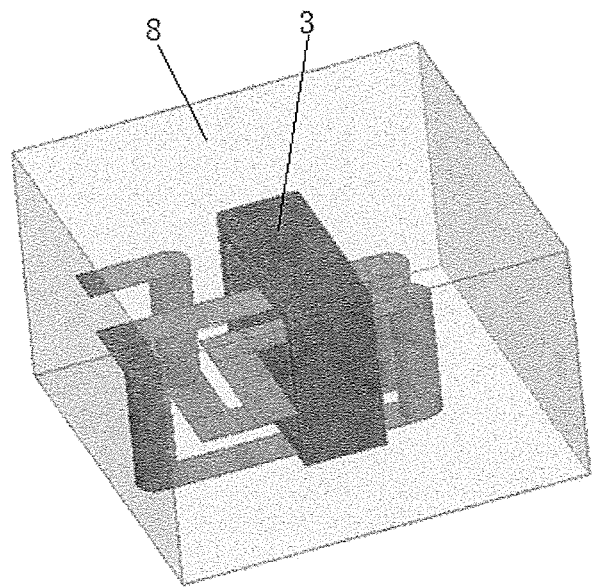
FIG. 6 is a three-dimensional schematic diagram of a circuit board according to Embodiment 3 of the present invention.
Figure 7:
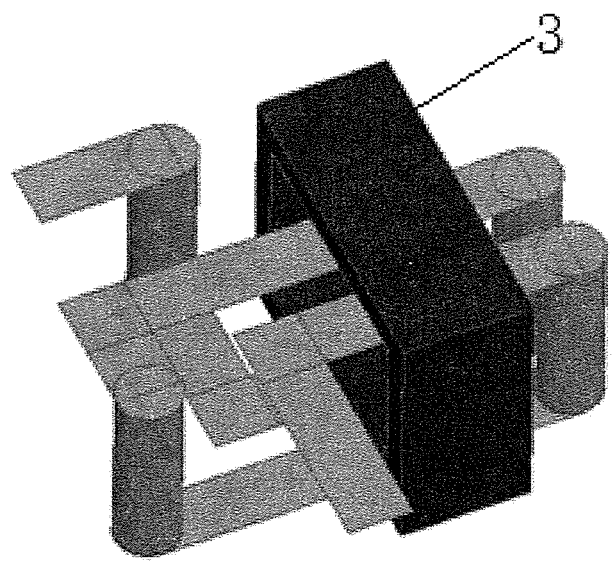
FIG. 7 is a three-dimensional schematic diagram of the magnetic core and the winding conductor illustrated in FIG. 6.
Figure 8:
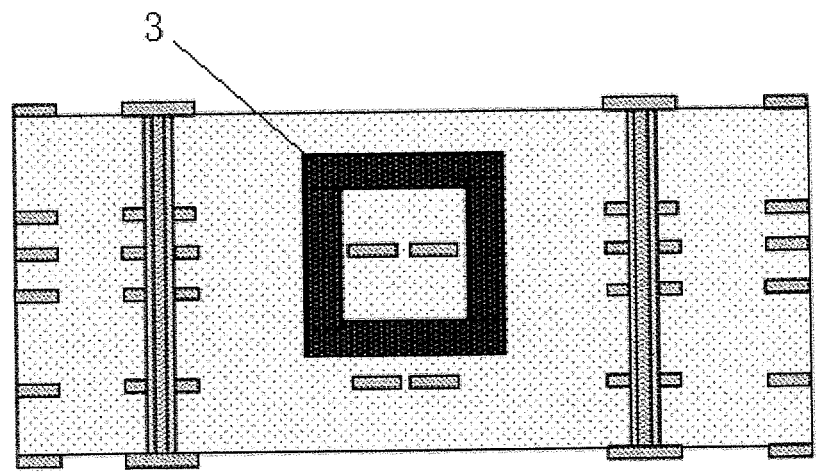
FIG. 8 is a sectional schematic diagram of the circuit board illustrated in FIG. 6.

As illustrated in FIG. 6 to FIG. 8, the winding conductor may be wound around a side column of the magnetic core 3. The wound wire within the same turn is located at two different layers, an upper layer and a lower layer, and the wound wire within different turns is located at the same layer.

Figure 9:
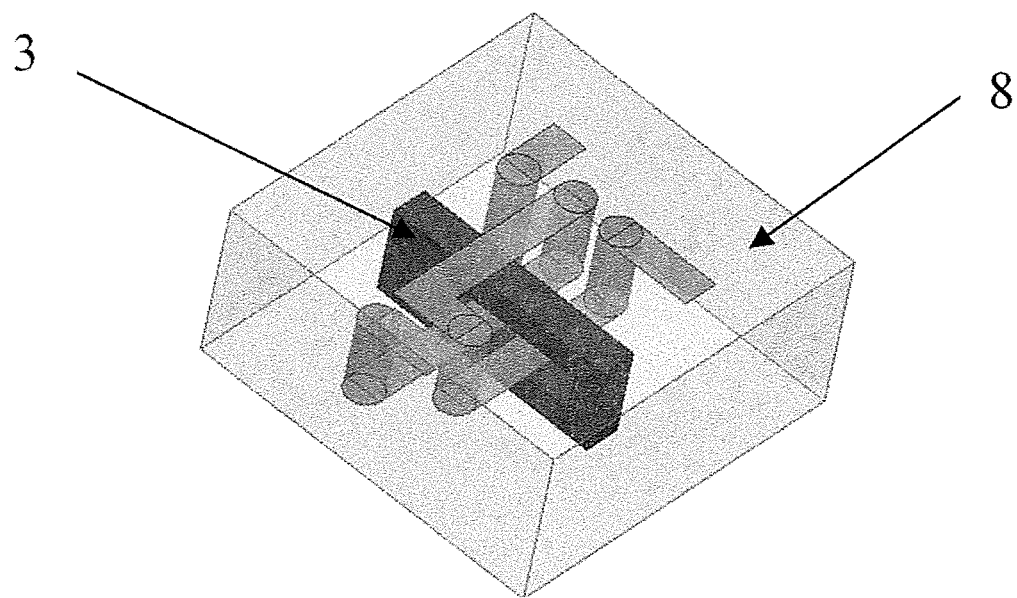
FIG. 9 is a three-dimensional schematic diagram of a circuit board according to Embodiment 3 of the present invention.
Figure 10:
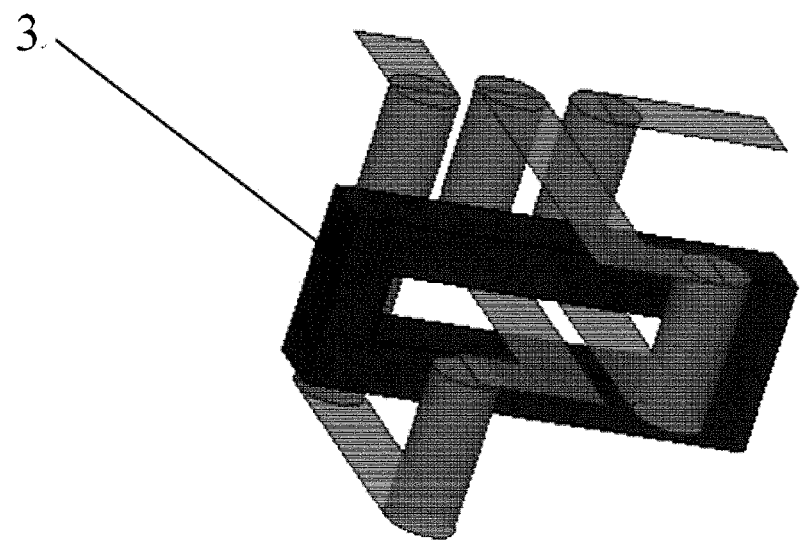
FIG. 10 is a three-dimensional schematic diagram of the magnetic core and the winding conductor illustrated in FIG. 9.
Figure 11:
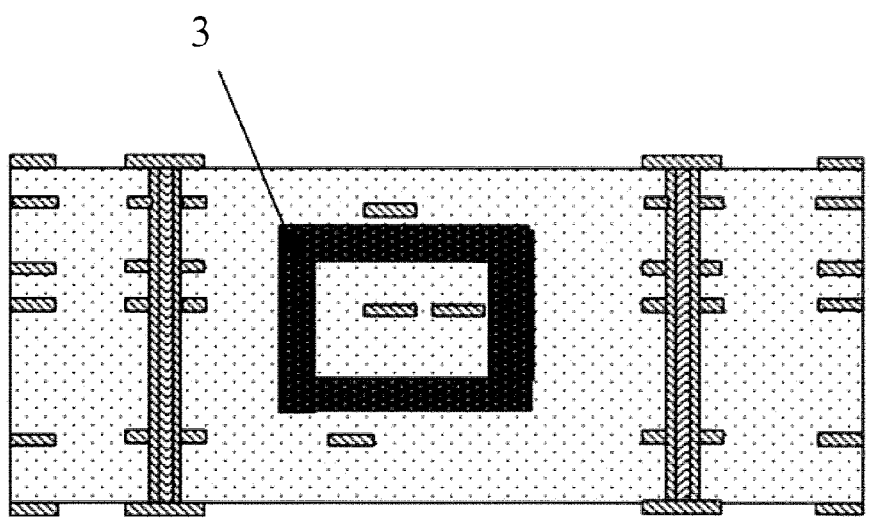
FIG. 11 is a sectional schematic diagram of the circuit board illustrated in FIG. 9.
Figure 12:
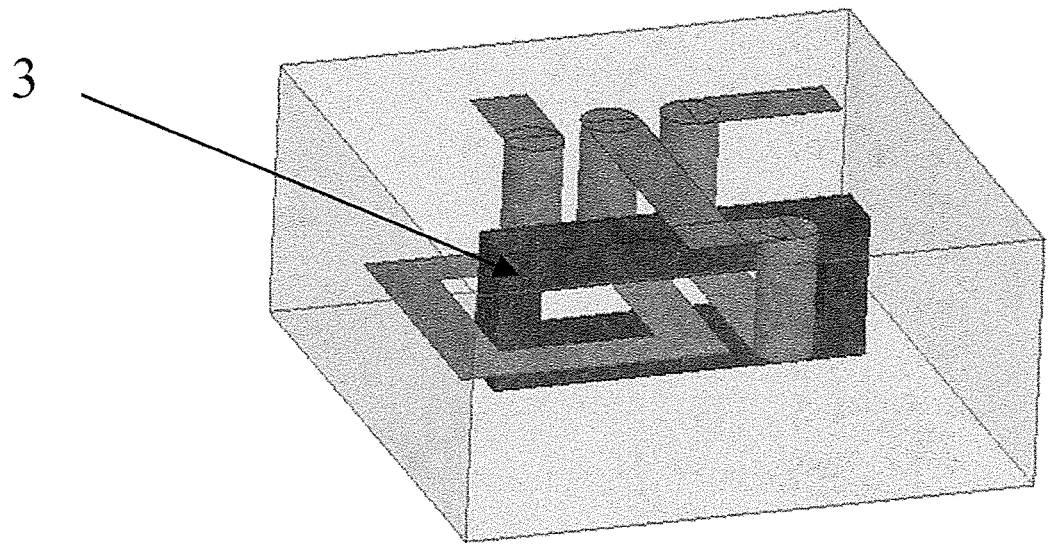
FIG. 12 is a three-dimensional schematic diagram of a circuit board according to Embodiment 3 of the present invention.
Figure 13:
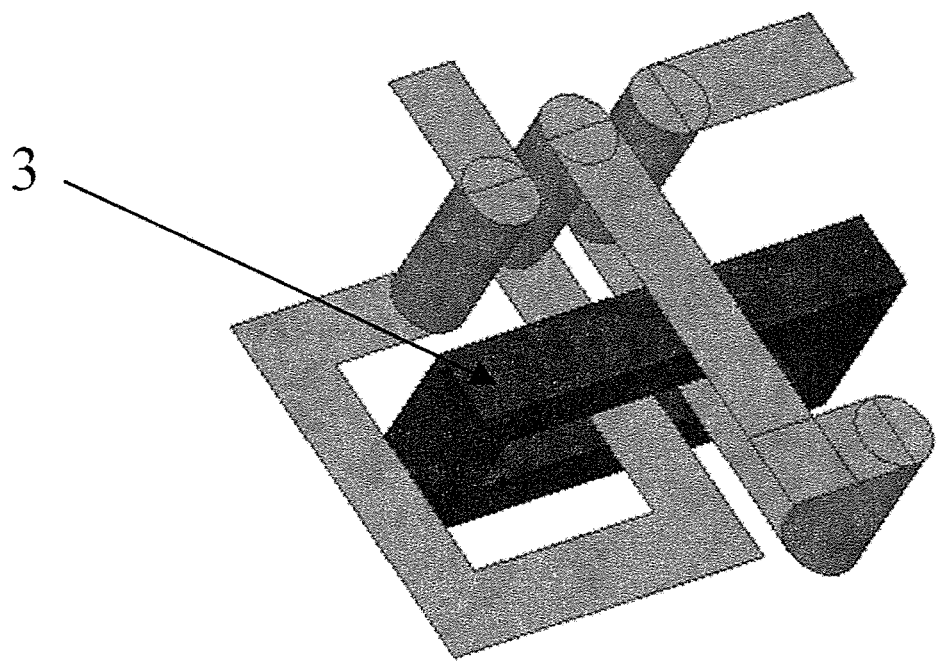
FIG. 13 is a three-dimensional schematic diagram of the magnetic core and the winding conductor illustrated in FIG. 12.
Figure 14:
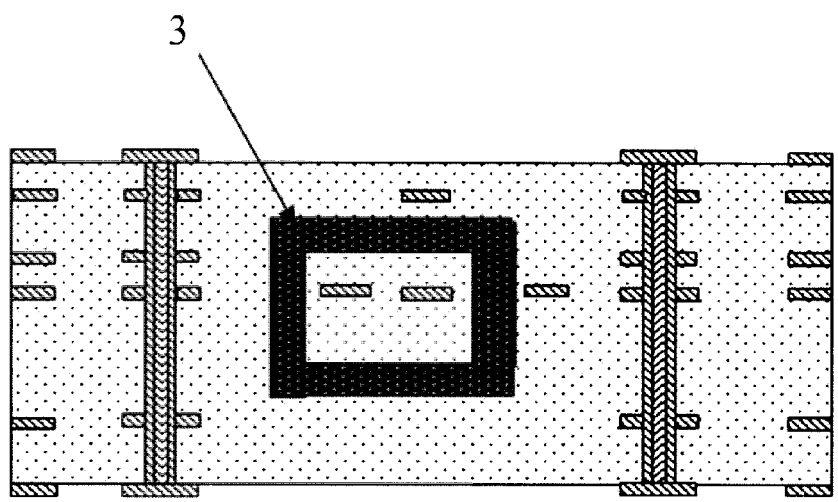
FIG. 14 is a sectional schematic diagram of the circuit board illustrated in FIG. 11.

It can be understood that, as illustrated in FIG. 9 to FIG. 11, the magnetic core 3 stands in the substrate 8. The winding (that is, the winding conductor) is formed by a copper sheet, a via hole or a side wall plating, and is wound around two different side columns (an upper side column and a lateral side column of the magnetic core 3) of the magnetic core 3. One turn of the winding conductor is wound around the upper side column of the magnetic core 3, and the other turn of the winding conductor is wound around a lower side column of the magnetic core 3. As illustrated in FIG. 12 to FIG. 14, the magnetic core 3 stands in the substrate 8. The winding (that is, the winding conductor) is formed by a copper sheet, a via hole or a side wall plating, and is wound around two different side columns (an upper side column and a lateral side column of the magnetic core 3) of the magnetic core 3. One turn of the winding conductor is wound around the upper side column of the magnetic core 3, and the other turn of the winding conductor is wound around the lateral side column of the magnetic core 3. The magnetic core 3 may be vertically or horizontally embedded into the substrate 8. The winding manner of embedding the magnetic core 3 is diversified. The winding conductor may be a combination of an extension of a conductive metal layer and a via hole, or may be a combination of the extension of the conductive metal layer and a plated metal layer on the side wall of the substrate 8, or may be a combination of the extension of the conductive metal layer, the plated metal layer on the side wall of the substrate 8, and a conductive via hole on the substrate 8. The number of winding turns may be a random value. The column of the magnetic core 3 around which each turn is wound may be the upper side column of the magnetic core 3, or may be the lower side column, or may be the lateral side column. The turns of the winding conductor may be wound around the same side column of the magnetic core, or may be wound around an opposite or adjacent side column of the magnetic core.

Embodiment 4

Figure 15:
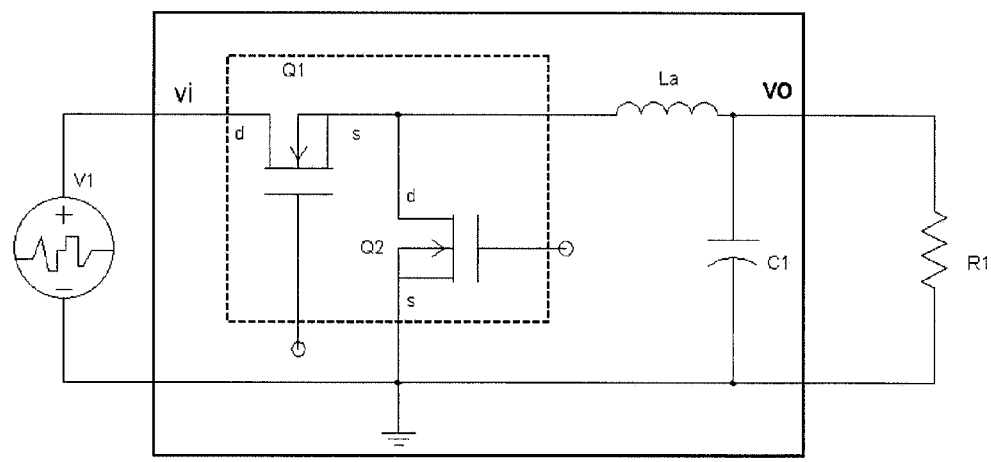
FIG. 15 is a schematic diagram of a circuit of a power conversion apparatus according to Embodiment 4 of the present invention.

As illustrated in FIG. 15, an embodiment of the present invention provides a power conversion apparatus. The power conversion apparatus includes the foregoing circuit board. A capacitor, a resistor, and a control module (control IC) that is configured to generate a control signal are arranged on the circuit board, where the capacitor, the resistor, and the control module are all connected to the substrate, and the capacitor, the resistor, and the control module are located on the same surface or different surfaces of the circuit board. Specifically, the control module is configured to generate a control signal to drive an internal or external power switch component to perform a corresponding switch-on or switch-off action and generate a desired electrical pulse signal. The foregoing circuit board, in collaboration with the capacitor, is configured to smooth the pulse signal generated by the switch component, and meanwhile store electromagnetic energy. In this way, the entire apparatus works collaboratively and sequentially to generate expected voltage and current signals and supply power to powered devices.

Specifically, as illustrated in FIG. 15, within a block enclosed by the bold solid lines, a schematic diagram of the power conversion apparatus in this embodiment is given. In FIG. 15, V1 is a direct current power supply that supplies power to the power conversion apparatus in this embodiment, and R1 is a powered device connected to a rear end of the power conversion apparatus in this embodiment. In FIG. 15, Q1 and Q2 are power switch components, which may be integrated into a control chip and correspond to the first electronic component 1 in the foregoing figures; and La is the magnetic core; C1 is the second electronic component 2.

The power conversion apparatus has a magnetic core 3 embedded into the substrate 8, a power supply IC apparatus, a capacitor, and other electronic components.

Alternatively, the power conversion apparatus has a magnetic core 3 embedded into the substrate 8, a power supply IC apparatus, a power switch component, a capacitor, other electronic components, and the like.

The power conversion apparatus is connected to other electronic devices by using the following forms of pins: BGA ball-shaped pins, surface mounted weld pad, castle-shaped pins, and the like, which, however, are not limited to such listed forms.

Certainly, it can be understood that, the foregoing circuit board may also be applicable to other electronic devices in addition to the power conversion apparatus.

Embodiment 5

An embodiment of the present invention further provides a method for fabricating a circuit board, including the following steps: with reference to FIG. 1a and FIG. 1b, preparing the substrate 8 and the magnetic core 3; opening a slot on the substrate 8 and embedding the magnetic core 3 into the substrate 8; arranging the first end-surface conductor 41, which is located on one side of the magnetic core 3, on the substrate 8; arranging the first side-surface conductor 43, which penetrates through the magnetic core 3 from the inner side of the magnetic core 3 and is connected to the first end-surface conductor 41, on the substrate 8; arranging the second end-surface conductor 42, which is located on the other side of the magnetic core 3, on the substrate 8; arranging the second side-surface conductor 44, which penetrates through the magnetic core 3 from the outer side of the magnetic core 3 and is connected to the second end-surface conductor 42, on the substrate 8, where the first end-surface conductor 41, the first side-surface conductor 43, the second end-surface conductor 42, and the second side-surface conductor 44 may form a turn of the winding conductor that is wound around the magnetic core 3. Specifically, a winding conductor with the proper number of turns may be set according to an actual condition.

Specifically, the first end-surface conductor 41 and the second end-surface conductor 42 may be arranged on the end surface of the substrate 8; the first end-surface conductor 41 and the second end-surface conductor 42 may be copper sheets, which may be formed in a manner such as etching.

Specifically, the first side-surface conductor 43 may be a conductive via hole, which may implement layer exchanging for signals. In a practical application, a hole may be drilled on the substrate 8, and a conductive material may be plated in the hole, where the conductive material may be copper or the like. The foregoing conductive via hole may be a blind via, a buried via, or a plated-through hole. The blind via is located on a surface of a top layer and a bottom layer of a printed circuit board, and has a specific depth. The blind via is used for connection of wires at an outer layer and wires at a lower inner layer. The buried via refers to a connection hole that is located on the inner layer of the printed circuit board, which does not extend to the surface of the circuit board. The foregoing two types of vias are both located on the inner layer of the circuit board. Before lamination, the vias are fabricated by using the plated-through hole formation process. During formation of the via hole, several inner layers may further be fabricated in an overlapping manner. The third type of hole is referred to as the plated-through hole. This type of hole penetrates through the entire circuit board, and may be used to implement internal interconnection or may be used as an installation pilot hole for a component.

Alternatively, with reference to FIG. 2, as an alternative solution for the conductive via hole, a plated-through hole penetrating through the substrate 8 and the center of the magnetic core 3 may be arranged, with respect to the area in which the magnetic core 3 is located, on the substrate 8; the first side-surface conductor 43 may be in a strip shape and plated on a side wall of the plated-through hole, or may also implement layer exchanging for signals. Likewise, the second side-surface conductor 44 may also be a conductive plated-through hole that is arranged on the substrate 8 and located on an outer side of the area in which the magnetic core 3 is located; alternatively, a plated-through hole penetrating through the substrate 8 may be arranged, with respect to the area in which the magnetic core 3 is located, on the substrate 8, and the second side-surface conductor 44 may be in a strip shape and plated on a side wall of the plated-through hole. In addition, the second side-surface conductor 44 may also be in a strip shape and plated on a side wall of the substrate 8.

The winding conductor may be formed by a combination of a copper sheet in combination with side-wall plating, or a steel sheet in combination with a conductive via hole, side-wall plating, and a via hole.

Specifically, a slot is arranged on the substrate 8, the magnetic core 3 is embedded into the slot on the substrate 8, and an electronic component, such as a chip and the like, is arranged on the front surface of the substrate 8.

In a first manner, with reference to FIG. 1a and FIG. 1b, using a case in which the magnetic core 3 is horizontally embedded into the substrate 8 as an example, the first electronic component 1 (a first chip) on the upper surface of the substrate 8 is led, through the first end-surface conductor 41 formed by a conductive copper sheet, into an area enclosed by an inner ring of the annular magnetic core 3 that is embedded into the substrate 8, vertically penetrates through the substrate 8 to a metal layer on the rear surface of the magnetic core 3 through the first side-surface conductor 43 formed by a conductive via hole, and extends to an edge of the substrate 8 through the second end-surface conductor 42 formed by the copper sheet on the layer. The second side-surface conductor 44 is formed by copper plating on the edge of the substrate 8 by using the plating process, and is electrically conductive to a base metal layer on the front surface of the magnetic core 3, extends to the area enclosed by the inner ring of the magnetic core 3 through the copper sheet, is electrically conductive to the metal layer on the rear surface of the substrate 8 through the conductive via hole, extends to the edge of the substrate 8 through the copper sheet on the metal layer on the rear surface of the substrate 8, is electrically conductive back to a metal layer on the front surface of the substrate 8 through a plated metal copper layer, and then extends from the copper sheet on the metal layer to the second electronic component 2 (the capacitor). The winding of two turns or more turns is implemented for the magnetic core 3 according to the foregoing process, thereby achieving corresponding inductance.

In a second manner, with reference to FIG. 3 and FIG. 4, using a case in which the magnetic core 3 is vertically embedded into the substrate 8 as an example, the first end-surface conductor 41 that is formed by the copper sheet and led out by the first electronic component 1 at the metal layer on the upper surface of the substrate 8 extends and is electrically conductive to a conductive metal layer of the base material through a conductive via hole (which may be a buried via, a blind via, or a plated-through hole), extends to the area enclosed by the magnetic core 3 through a conductive copper sheet, and is electrically conductive to a metal layer in the area enclosed by the magnetic core 3 through the conductive via hole, extends through the copper sheet and horizontally (parallel to the upper side column of the magnetic core 3), penetrates through the area enclosed by the magnetic core 3, is electrically conductive to a metal layer on the front surface of the substrate 8 by using a conductive via hole, extends through the copper sheet that is located on the front surface of the substrate 8 and horizontally (parallel to the upper side column of the magnetic core 3), penetrates through the upper surface of the upper side column of the magnetic core 3, and is electrically conductive to the metal layer of the substrate 8 in the area enclosed by the magnetic core 3 through the conductive via hole. At this layer, the copper sheet is led out from a conductive via hole 7, extends horizontally (parallel to the upper side column of the magnetic core 3), penetrates through the area enclosed by the magnetic core 3, and is then electrically conductive to a corresponding layer (generally a layer higher than the upper side column of the magnetic core 3). The winding of two turns or more turns is implemented for the magnetic core 3 according to the foregoing process, thereby achieving corresponding inductance.

In a third manner, similar to the winding manner in the case in which the magnetic core 3 is vertically embedded into the substrate 8, this embodiment further discloses another winding manner. With reference to FIG. 6, the winding process is similar to the foregoing process. FIG. 8 is a sectional diagram thereof. The winding manner is characterized in that the magnetic core 3 is embedded into the substrate 8, visually the magnetic core 3 stands in the substrate 8, and the winding is formed by a copper sheet, a via hole, or side-wall plating, where the winding conductor may be wound around a side column of the magnetic core 3, the wound wire within the same turn is located at two different layers, an upper layer and a lower layer, and the wound wire within different turns is located at the same layer.

In a fourth manner, the winding process is similar to the foregoing process. FIG. 9 is a schematic diagram of the winding process, and FIG. 11 is a sectional diagram thereof. The winding is characterized in that the magnetic core 3 is embedded into the substrate 8, visually the magnetic core 3 stands in the substrate 8, and the winding is formed by a copper sheet, a via hole, or side-wall plating, where the winding is performed around two different side columns of the magnetic core 3 (upper and lower side columns of the magnetic core 3), where one turn of the winding conductor is wound around the lower side column of the magnetic core 3, and the other turn of the winding conductor is wound around the upper side column of the magnetic core 3.

In a fifth manner, the winding process is similar to the foregoing process. FIG. 12 is a schematic diagram of the winding process, and FIG. 14 is a sectional diagram thereof. The winding is characterized in that the magnetic core 3 is embedded into the substrate 8, visually the magnetic core 3 stands in the substrate 8, and the winding is formed by a copper sheet, a via hole, or side-wall plating, where the winding is performed around two different side columns of the magnetic core 3 (upper and lateral side columns of the magnetic core 3), where one turn of the winding conductor is wound around the upper side column of the magnetic core 3, and the other turn of the winding conductor is wound around the lateral side column of the magnetic core 3.

It can be understood that, in this embodiment, the arrangement manner and the winding manner of the magnetic core 3 are not limited to the manners listed above. With respect to the magnetic core 3 that is horizontally embedded into the substrate 8, the winding manner of embedding the magnetic core 3 is diversified. The winding conductor may be a combination of an extension of a conductive metal layer and a via hole, or may be a combination of the extension of the conductive metal layer and a plated metal layer on the side wall of the substrate 8, or may be a combination of the extension of the conductive metal layer, the plated metal layer on the side wall of the substrate 8, and a conductive via hole on the substrate 8. With respect to the magnetic core 3 that is vertically embedded into the substrate 8, the winding manner of embedding the magnetic core 3 is diversified. The winding conductor may be a combination of an extension of a conductive metal layer and a via hole, or may be a combination of the extension of the conductive metal layer and a plated metal layer on the side wall of the substrate 8, or may be a combination of the extension of the conductive metal layer, the plated metal layer on the side wall of the substrate 8, and a conductive via hole on the substrate 8. The number of winding turns may be a random value. The column of the magnetic core 3 around which each turn is wound may be an upper side column of the magnetic core 3, or may be a lower side column, or may be a lateral side column. The turns may be wound around the same side column of the magnetic core, or may be wound around different side columns of the magnetic core. According to the circuit board, the power conversion apparatus having the circuit board, and the method for fabricating the circuit board provided by the present invention, the magnetic core 3 is embedded and different manners of winding the magnetic core 3 are used, which may reduce the usage area of the substrate 8 and flexibly use a wire routing space of the conductive layer of the substrate 8. Different turns may be wound as required, which achieves larger inductance, improves inductance consistency, saves materials, and reduces cost for fabricating a power conversion apparatus.

Specifically, the embedded magnetic core 3 may have an air gap or no air gap. With respect to the embedded magnetic core 3 having an air gap, during embedding of the magnetic core 3, fool-proofing design is required, and a direction of the air gap needs to be controlled. For example, a shear angle, an asymmetrical design for the magnetic core 3, and the like are used.

A material of the magnetic core 3 may be a ferrite, a metal power core, an amorphous alloy, a permanent magnet, or a like proper material.

The foregoing descriptions are merely preferred embodiments of the present invention, but are not intended to limit the present invention. Any modifications, equivalent replacements, or improvements made without departing from the spirit and principle of the present invention shall fall within the protection scope of the present invention.

What is claimed is:

1. A circuit board, comprising:
a substrate and a magnetic core, wherein the magnetic core is in an annular shape and the magnetic core has an inner side and an outer side, wherein the magnetic core is embedded into the substrate, at least one turn of a winding conductor wound around the magnetic core is arranged on the substrate, each turn of the winding conductor comprises a first end-surface conductor and a second end-surface conductor that are separately arranged on two ends of the magnetic core, and each turn of the winding conductor further comprises a first side-surface conductor that penetrates through the inner side of the magnetic core and a second side-surface conductor that is arranged on the outer side of the magnetic core, wherein the first side-surface conductor is electrically connected to the first end-surface conductor and the second end-surface conductor, and the second side-surface conductor is electrically connected to the second end-surface conductor, the second end-surface conductor disposed laterally to an edge of the substrate and extending orthogonally along the edge of the substrate to the second side-surface conductor.

2. The circuit board according to claim 1, wherein the first end-surface conductor is arranged on one end surface of the substrate, and the second end-surface conductor is arranged on the other end surface of the substrate.

3. The circuit board according to claim 1, wherein:
a first via hole is arranged on the substrate and located on the inner side of the magnetic core, and the first side-surface conductor is a conductor filled in the first via hole; or
a first plated-through hole that penetrates through and arranged on the inner side of the magnetic core is arranged on the substrate, and the first side-surface conductor is a conductor that is plated on an inner side wall of the first plated-through hole.

4. The circuit board according to claim 1, wherein:
a second via hole is arranged on the substrate and located on the outer side of the magnetic core, and the second side-surface conductor is a conductor filled in the second via hole; or
a second plated-through hole is arranged on the substrate, wherein the second plated-through hole is located on the outer side of the magnetic core, and the second side-surface conductor is a conductor that is plated on an inner side wall of the second plated-through hole.

5. The circuit board according to claim 1, wherein the second side-surface conductor is a conductor plated on a side wall of the substrate.

6. The circuit board according to claim 1, wherein the magnetic core is vertically or horizontally embedded into the substrate.

7. The circuit board according to claim 1, wherein the magnetic core has an annular shape, a polygonal annular shape, a combined shape of a "U" shape and an "I" shape, a combined shape of an "E" shape and an "I" shape, or a combined shape of an "E" shape and another "E" shape.

8. The circuit board according to claim 1, wherein:
the magnetic core has a polygonal annular shape and a plurality of head-tail connected edges; and
the winding conductor has at least two turns, wherein at least one turn of the winding conductor is wound around one edge of the magnetic core and at least the other one turn of the winding conductor is wound around another edge of the magnetic core, or all the winding conductor is wound around a same edge of the magnetic core.

9. The circuit board according to claim 1, wherein:
top and bottom ends of the substrate are end surfaces, wherein the end surfaces comprise a front surface and a rear surface that are oppositely arranged, and an outer peripheral wall of the substrate is a side surface of the substrate;
an area formed by projection of the magnetic core on the front surface or rear surface of the substrate is an area in which the magnetic core is located;
the first end-surface conductor is arranged on the front surface of the substrate, and the second end-surface conductor is arranged on the rear surface of the substrate;
the winding conductor has at least two turns, and the winding conductor comprises a first turn of the winding conductor and a second turn of the winding conductor, a first electronic component is arranged on the front surface of the substrate, and the magnetic core is horizontally arranged, wherein the first electronic component is located outside the area in which the magnetic core is located; and
the first end-surface conductor of the first turn of the winding conductor is connected to the first electronic component and extends to the area in which the magnetic core is located, the first side-surface conductor of the first turn of the winding conductor is a first conductive via hole, the first end-surface conductor of the first turn of the winding conductor is electrically conductive to a metal layer on the rear surface of the substrate through the first conductive via hole, the second end-surface conductor of the first turn of the winding conductor is connected to the first side-surface conductor of the first turn of the winding conductor, extends to the side surface of the substrate, and is connected to the second side-surface conductor, and the second side-surface conductor of the first turn of the winding conductor is arranged on the side surface of the substrate and connected to the second end-surface conductor of the second turn of the winding conductor; the first end-surface conductor of the second turn of the winding conductor is connected to the second side-surface conductor of the first turn of the winding conductor and extends to the area in which the magnetic core is located, the first side-surface conductor of the second turn of the winding conductor is a second conductive via hole, the first end-surface conductor of the second turn of the winding conductor is electrically conductive to the metal layer on the rear surface of the substrate through the second conductive via hole, the second end-surface conductor of the second turn of the winding conductor is connected to the first side-surface conductor of the second turn of the winding conductor and extends to the side surface of the substrate, and the second side-surface conductor of the second turn of the winding conductor is arranged on the side surface of the substrate and connected to the second end-surface conductor of the first turn of the winding conductor.

10. The circuit board according to claim 1, wherein:
top and bottom ends of the substrate are end surfaces, wherein the end surfaces comprise a front surface and a rear surface that are oppositely arranged, and an outer peripheral wall of the substrate is a side surface of the substrate;
an area formed by projection of the magnetic core on the front surface or rear surface of the substrate is an area in which the magnetic core is located;

the first end-surface conductor is arranged on the front surface of the substrate, and the second end-surface conductor is arranged on the rear surface of the substrate;

the winding conductor has at least two turns, comprising a first turn of the winding conductor and a second turn of the winding conductor, a first electronic component is arranged on the front surface of the substrate, and the magnetic core is horizontally arranged, wherein the first electronic component is located outside the area in which the magnetic core is located;

a plated-through hole penetrating through the substrate is arranged within the area in which the magnetic core is located;

the first end-surface conductor of the first turn of the winding conductor is connected to the first electronic component, extends to a side wall of the plated-through hole, and is connected to the first side-surface conductor of the first turn of the winding conductor, the first side-surface conductor of the first turn of the winding conductor is a first conductive layer arranged on the side wall of the plated-through hole, the first end-surface conductor of the first turn of the winding conductor is electrically conductive to a metal layer on the rear surface of the substrate through the first conductive layer, the second end-surface conductor of the first turn of the winding conductor is connected to the first side-surface conductor of the first turn of the winding conductor and extends to the side surface of the substrate, and the second side-surface conductor of the first turn of the winding conductor is arranged on the side surface of the substrate and connected to the second end-surface conductor of the first turn of the winding conductor; and the first end-surface conductor of the second turn of the winding conductor is connected to the second side-surface conductor of the first turn of the winding conductor and extends to the side wall of the plated-through hole, the first side-surface conductor of the second turn of the winding conductor is a second conductive layer arranged on the side wall of the plated-through hole, the first end-surface conductor of the second turn of the winding conductor is electrically conductive to the metal layer on the rear surface of the substrate through the second conductive layer, the second end-surface conductor of the second turn of the winding conductor is connected to the second conductive layer and extends to the side surface of the substrate, and the second side-surface conductor of the second turn of the winding conductor is arranged on the side surface of the substrate and connected to the second end-surface conductor of the second turn of the winding conductor.

11. The circuit board according to claim 1, wherein:

top and bottom ends of the substrate are end surfaces, wherein the end surfaces comprise a front surface and a rear surface that are oppositely arranged, and an outer peripheral wall of the substrate is a side surface of the substrate;

an area formed by projection of the magnetic core on the front surface or rear surface of the substrate is an area in which the magnetic core is located;

the winding conductor has at least two turns, comprising a first turn of the winding conductor and a second turn of the winding conductor, a first electronic component is arranged on the front surface of the substrate, and the magnetic core is vertically arranged; an inner layer of the substrate has a conductor layer;

the first end-surface conductor of the first turn of the winding conductor comprises a first section of an conductor that is connected to the first electronic component and located on the front surface of the substrate, and a second section of the conductor that is connected to the first section of the conductor and electrically conductive to the inner layer of the substrate, wherein the second section of the connector is the conductor layer arranged on the inner layer of the substrate, and the conductor layer is located between the front surface and the rear surface of the substrate;

a third conductive via hole adjacent to the magnetic core is arranged on the substrate, the first side-surface conductor of the first turn of the winding conductor is connected to the second section of the conductor and electrically conductive to the third conductive via hole, the second end-surface conductor of the first turn of the winding conductor is connected to the first side-surface conductor of the first turn of the winding conductor and penetrates through the magnetic core, the second side-surface conductor of the first turn of the winding conductor is connected to the second end-surface conductor of the first turn of the winding conductor and electrically conductive to a front surface of the substrate; and the first end-surface conductor of the second turn of the winding conductor is connected to the second side-surface conductor of the first turn of the winding conductor, the first side-surface conductor of the second turn of the winding conductor is a fourth conductive via hole that is connected to the first end-surface conductor of the second turn of the winding conductor and electrically conductive to the area in which the magnetic core is located, the second end-surface conductor of the second turn of the winding conductor is connected to the first side-surface conductor of the second turn of the winding conductor and penetrates through the magnetic core, the second side-surface conductor of the second turn of the winding conductor is connected to the second end-surface conductor of the second turn of the winding conductor and electrically conductive to the front surface of the substrate.

12. An apparatus comprising the circuit board according to claim 1, wherein a capacitor, a resistor, and a control module configured to generate a control signal are arranged on the circuit board, wherein the capacitor, the resistor, and the control module are all connected to the substrate.

13. The apparatus according to claim 12, wherein the first end-surface conductor is arranged on one end surface of the substrate, and the second end-surface conductor is arranged on the other end surface of the substrate.

14. The apparatus according to claim 12, wherein:

a first via hole is arranged on the substrate and located on the inner side of the magnetic core, and the first side-surface conductor is a conductor filled in the first via hole; or a first plated-through hole that penetrates through and arranged on the inner side of the magnetic core is arranged on the substrate, and the first side-surface conductor is a conductor that is plated on an inner side wall of the first plated-through hole.

15. The apparatus according to claim 12, wherein:

a second via hole is arranged on the substrate and located on the outer side of the magnetic core, and the second side-surface conductor is a conductor filled in the second via hole; or a second plated-through hole is arranged on the substrate, wherein the second plated-through hole is located on the outer side of the magnetic core, and the second side-surface conductor is a conductor that is plated on an inner side wall of the second plated-through hole.

* * * * *